United States Patent
Park et al.

(10) Patent No.: US 7,074,695 B2
(45) Date of Patent: Jul. 11, 2006

(54) DBG SYSTEM AND METHOD WITH ADHESIVE LAYER SEVERING

(75) Inventors: Seung Wook Park, Seoul (KR); Hyun Jin Park, Sunngnam-si (KR)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/959,713

(22) Filed: Oct. 6, 2004

(65) Prior Publication Data

US 2005/0196941 A1    Sep. 8, 2005

Related U.S. Application Data

(60) Provisional application No. 60/549,332, filed on Mar. 2, 2004.

(51) Int. Cl.
   *H01L 21/46* (2006.01)
(52) U.S. Cl. ............... 438/460; 438/33; 438/68
(58) Field of Classification Search .......... 438/33, 438/68, 107, 113, 460, 462, 464
   See application file for complete search history.

(56) References Cited

U.S. PATENT DOCUMENTS

| | | |
|---|---|---|
| 5,140,404 A | 8/1992 | Fogal et al. |
| 5,218,229 A | 6/1993 | Farnworth |
| 5,323,060 A | 6/1994 | Fogal et al. |
| 5,372,883 A | 12/1994 | Shores |
| 5,776,799 A | 7/1998 | Song et al. |
| 5,945,733 A | 8/1999 | Corbett et al. |
| 6,265,763 B1 | 7/2001 | Jao et al. |
| 6,340,846 B1 | 1/2002 | LoBianco et al. |
| 6,351,028 B1 | 2/2002 | Akram |

(Continued)

OTHER PUBLICATIONS

Lintec Semiconductor-Related Products Web Site, "Adwill Semiconductor-Related Products", 1 page, http://www.lintec.co.jp/e-dept/english/advill/adwill.html, downloaded Mar. 1, 2004.

(Continued)

*Primary Examiner*—David Nelms
*Assistant Examiner*—Quoc Hoang
(74) *Attorney, Agent, or Firm*—Bill Kennedy; Haynes Beffel & Wolfeld LLP

(57) ABSTRACT

An array of grooves (23) is formed in a first side (12) of a wafer (10) during a wafer processing method. A back grinding tape (16) is adhered to the first side. An amount of material is removed from the second side (20) of the wafer. An adhesive layer (30) is applied to the second side. Dicing tape (24) is applied to the adhesive layer to create a first wafer assembly (32). The first wafer assembly is supported on a support surface (34) with the dicing tape facing the support surface and the back grinding tape exposed. The back grinding tape is removed and the adhesive layer is severed through the array of grooves to create individually removable die (28).

14 Claims, 2 Drawing Sheets

U.S. PATENT DOCUMENTS

| | | |
|---|---|---|
| 6,388,313 B1 | 5/2002 | Lee et al. |
| 6,472,758 B1 | 10/2002 | Glenn et al. |
| 6,503,821 B1 | 1/2003 | Farquhar et al. |
| 6,569,709 B1 | 5/2003 | Derderian |
| 6,593,662 B1 | 7/2003 | Pu et al. |
| 6,620,651 B1 | 9/2003 | He et al. |
| 6,638,865 B1 * | 10/2003 | Tanaka ................ 438/692 |
| 6,650,009 B1 | 11/2003 | Her et al. |
| 6,885,093 B1 | 4/2005 | Lo et al. |
| 2003/0038357 A1 | 2/2003 | Derderian |
| 2003/0038374 A1 | 2/2003 | Shlm et al. |
| 2003/0178710 A1 | 9/2003 | Kang et al. |
| 2004/0026768 A1 | 2/2004 | Taar et al. |
| 2005/0090050 A1 | 4/2005 | Shim et al. |

OTHER PUBLICATIONS

Lintec Semiconductor-Related Products Web Site, "Products for Dicing Process", 2 pages, http://www.lintec.co.jp/e-dept/english/adwill/diceproces.html, downloaded Mar. 1, 2004.

Lintec Semiconductor-Related Products Web Site, "Products for back-grinding process", 1 page, http://www.lintec.co.jp/e-dept/english/adwill/bgproces.html, Downloaded Mar. 1, 2004.

* cited by examiner

DBG SYSTEM AND METHOD WITH ADHESIVE LAYER SEVERING

CROSS-REFERENCE TO RELATED APPLICATIONS

This application claims priority from U.S. Provisional Application No. 60/549,332, filed Mar. 2, 2004, titled "Substrate processing system and method".

BACKGROUND

Wafer thinning technology is important to package development. Current wafer thinning methods include the in-line wafer B/G (Back Grinding) system and the DBG (Dicing Before Grinding) process. The inline wafer B/G systems have used the film adhesive process whereby the wafer is thinned by backgrinding and then is diced. However, a conventional DBG process did not use the film adhesive process because the separated die created by the DBG process had a tilt after B/G tape removing.

A conventional dice before grinding process is shown in FIGS. 1–7. FIG. 1 illustrates a wafer 10 having a first or front side 12 being grooved using a grinding wheel 14 or other grooving technique. FIG. 2 illustrates adhering a back grinding tape 16 to side 12 using a roller 18. The structure of FIG. 2 is then inverted exposing the second or back side 20 of wafer 10 at a material removal station 21 permitting a grinding wheel 22 to grind second side 20. Grinding wheel 22 removes sufficient material to expose the grooves 23 formed by grinding wheel 14 thus creating a diced wafer 25. FIG. 4 illustrates the application of dicing tape 24 to second side 20 using a roller 26. The structure of FIG. 4 is then inverted to permit back grinding tape 16 to be remove as illustrated in FIG. 5. FIG. 6 illustrates the structure of FIG. 5 with the back grinding tape completely removed to expose the diced wafer 25. FIG. 7 is an enlarged view of a number of the diced die 28 of FIG. 6. FIG. 7 illustrates what is termed die tilt. Die tilt is created because the adhesive strength of dicing tape 26 is not sufficient to prevent the shifting of die 28 during the removal of back grinding tape 16. This die tilt is a problem because it makes picking and placing die 28 more difficult thus increasing the complexity and cost of subsequent chipmaking operations.

SUMMARY

The present invention is directed to wafer processing method and apparatus in which an adhesive layer is used between a dicing tape and a grooved wafer. A second grinding or other severing step is used to sever the adhesive layer through the grooves. This use of the adhesive layer helps to prevent undesirable die tilt; die tilt can create problems during the process of placing individual die onto a substrate.

A first aspect of the invention is directed to a wafer processing method. An array of grooves is formed in a first side of a wafer. A back grinding tape is adhered to the first side. An amount of material is removed from the second side of the wafer. An adhesive layer is applied to the second side. Dicing tape is applied to the adhesive layer to create a first wafer assembly. The first wafer assembly is supported on a support surface with the dicing tape facing the support surface and the back grinding tape exposed. The back grinding tape is removed and the adhesive layer is severed through the array of grooves to create individually removable die. The method may also include forming the array of grooves in the first side of the wafer to a chosen depth with the material removing step being carried out to create a wafer having a chosen thickness. The forming and removing steps may be carried out so that the chosen depth is greater than, for example about 20% greater than, the chosen thickness. The forming and removing steps may also be carried out so that the chosen depth is less than, for example about 70–90% of, the chosen thickness so that the severing step severs both the adhesive layer and wafer through the array of grooves.

A second aspect of the invention is directed to a wafer processing system for processing a wafer having an array of grooves formed in a first side of a wafer and a back grinding tape adhering to the first side. The assembly includes a material removal station at which an amount of material is removable from a second side of the wafer. The assembly also includes a dicing tape application station at which the wafer has an adhesive layer and a dicing tape applied to the second side, with the adhesive layer between the second side and the dicing tape, to create a first wafer assembly. A support surface station comprises a support surface. First wafer assembly transfer apparatus is arranged and adapted to transfer the first wafer assembly from the dicing tape application station to the support surface station with the dicing tape facing the support surface and the back grinding tape exposed. The support surface station also includes means for removing the back grinding tape and means for severing the adhesive layer through the array of grooves to create individually removable die.

Various features and advantages of the invention will appear from the following description in which the preferred embodiments have been set forth in detail in conjunction with the accompanying drawings.

BRIEF DESCRIPTION OF THE DRAWINGS

FIGS. 8–14 illustrate a wafer processing system and method according to the invention, FIG. 8 being similar to FIG. 4 with the addition of a film adhesive layer between the dicing tape and the diced wafer;

FIG. 9 illustrates the structure of FIG. 8 flipped 180° with the back grinding tape being removed;

FIGS. 12 and 13 illustrate the second grinding or other severing step removing either (1) the film adhesive and a portion of the dicing tape at the base of the grooves, according to the embodiment of FIG. 10B, or (2) the wafer remaining at the base of the grooves as well as the film adhesive and a portion of the dicing tape at the base of the grooves, according to the embodiment of FIG. 11B; and FIG. 14 is enlarged view similar to FIG. 7 but illustrating how the individual die remain properly positioned after the removal of the back grinding tape in FIG. 9 and the second grinding or other severing step of FIGS. 12 and 13.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
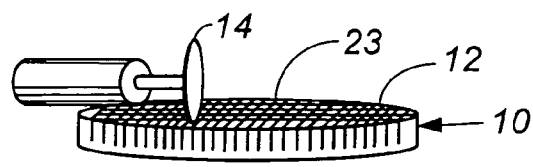
FIG. 1 illustrates grinding of the front side of a wafer using a grinding wheel.
Figure 2:
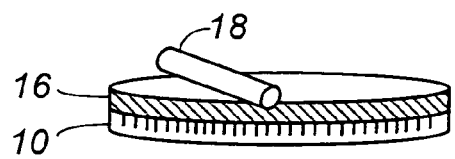
FIG. 2 shows adhering a back grinding tape to the front side of a wafer.
Figure 3:
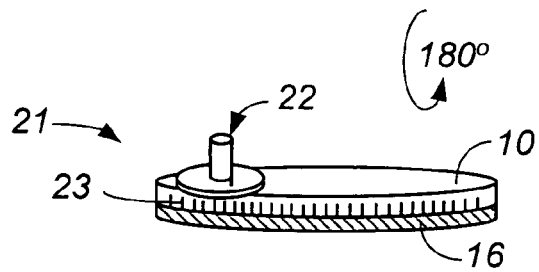
FIG. 3 shows grinding of the backside of the wafer.

FIGS. 8–14 illustrate a wafer processing system and method according to the invention. The present invention may initially proceed as described above with reference to FIGS. 1–3 with like reference numerals referring to like elements but with the following distinctions. The groove forming step of FIG. 1 is carried out so that grooves are formed in first side 12 to a chosen depth and the material removing step of FIG. 3 is carried out at material removal station 21 to create a diced wafer 25 having a chosen thickness. The groove forming and material removing steps may be carried out so that the chosen depth of grooves 23 is greater than, such as 20% greater than, the chosen thickness, as in the prior art and as illustrated in FIGS. 10A and 10B. However, the groove forming and material removing steps may also be carried out so that the chosen depth of grooves 23 is less than the chosen thickness, such as 70–90% of the chosen thickness, as is illustrated in FIGS. 10A and 10B.

Figure 4:
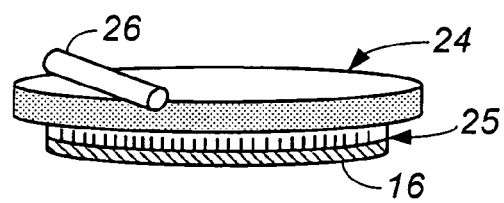
FIG. 4 illustrates mounting dicing tape on the ground backside of the wafer.
Figure 5:
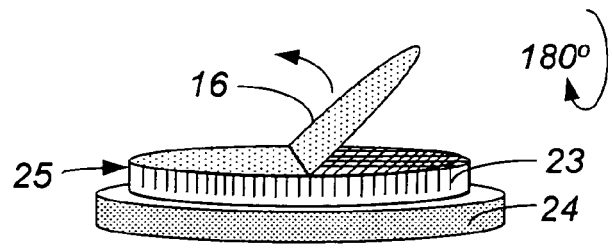
FIG. 5 illustrates the removal of the back grinding tape after the structure of FIG. 4 has been flipped 180°.
Figure 6:
FIG. 6 shows the structure of FIG. 5 after the removal of the back grinding tape.
Figure 8:
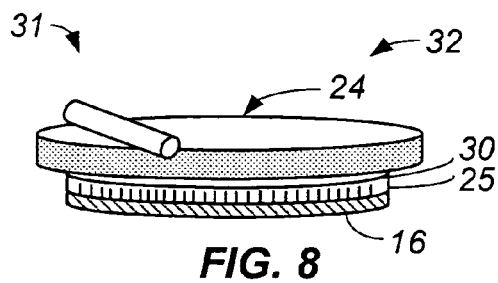

FIG. 8 is similar to FIG. 4. However, adhesive layer 30, preferably a film adhesive layer, is positioned at a dicing tape application station 31 between dicing tape 24 and diced wafer 25 to create a first wafer assembly 32. Dicing tape 24 and adhesive layer 30 may be simultaneously applied to diced wafer 25 as a multiple-layered tape or they may be applied separately. Adhesive layer 30 maybe a conventional film adhesive, such as available from Lintec Corporation as Lintec LE5000. The thickness of the film adhesive used to create adhesive layers preferably ranges from 20–75μ, and preferably about 40μ.

Figure 9:
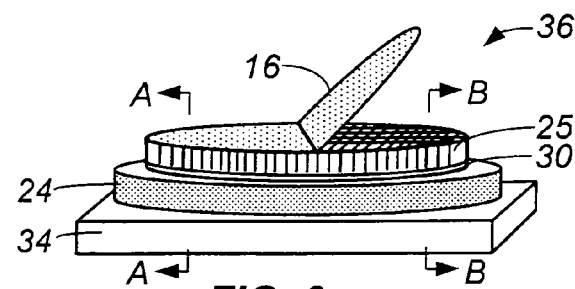

FIG. 9 illustrates the first wafer assembly 32 of FIG. 8 flipped 180° and resting on a vacuum table 34, or other support surface, at a support surface station 36. Back grinding tape 16 is shown being removed at support surface station 36.

Figure 10A:
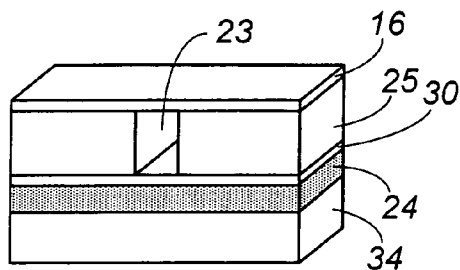
FIGS. 10A and 10B are simplified cross sectional views taken along lines A—A and B—B of FIG. 9 illustrating that the grooves formed in the wafer extended sufficiently far so that the grooves are exposed after the wafer grinding step of FIG. 3.
Figure 10B:
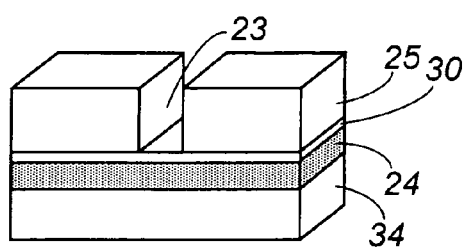

FIGS. 10A and 10B are simplified cross sectional views taken along lines A—A and B—B illustrating that grooves 23 formed in wafer 10 extended sufficiently far so that after the wafer grinding step, such as in FIG. 3, grooves 23 are exposed. That is, the groove forming step of FIG. 1 is carried out so that grooves 23 are formed in first side 12 to a chosen depth and the material removing step of FIG. 3 is carried out to create a diced wafer 25 having a chosen thickness. The groove forming and material removing steps are be carried out so that the chosen depth of grooves 23 is greater than, such as 20% greater than, the chosen thickness to create the structure illustrated in FIGS. 10A and 10B.

Figure 11A:
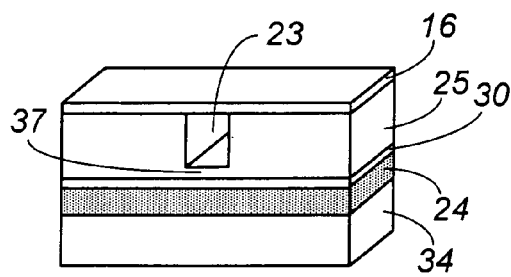
FIGS. 11A and 11B are views similar to FIGS. 10A and 10B of an alternative embodiment in which the grooving step of FIG. 1 and the grinding step of FIG. 3 are such that the grooves are not exposed after the grinding step, so that after the grinding step a portion of the wafer at the base of the grooves remains to further restrain subsequent die tilt.
Figure 11B:
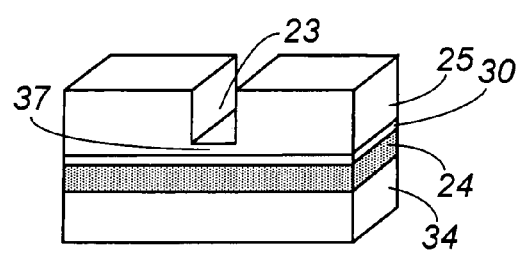

FIGS. 11A and 11B illustrate an alternative embodiment in which the grooving step of FIG. 1 and the grinding step of FIG. 3 are such that grooves 23 are not exposed after the grinding step. Therefore, a portion 37 of diced wafer 25 at the base of grooves 23 remains to further restrain subsequent die tilt. That is, the groove forming and material removing steps are carried out so that the chosen depth of grooves 23 is less than the chosen thickness, such as 70–90% of the chosen thickness.

Figure 7:
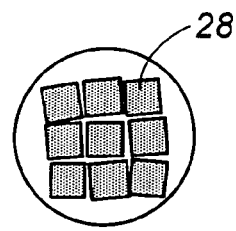
FIG. 7 is enlarged illustration showing die tilt of the die of FIG. 6, FIGS. 1–7 being conventional.
Figure 12:
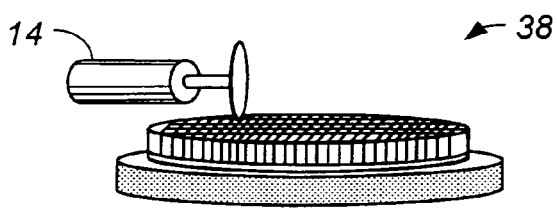
Figure 13:
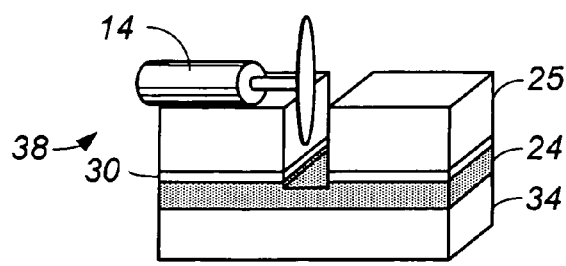
Figure 14:
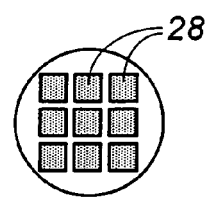

The use of adhesive layer 30, as with FIG. 10B, or both adhesive layer 30 and wafer portion 37, as with FIG. 11B, helps to ensure that die tilt, illustrated in FIG. 7, does not occur. However, this additional stability requires an additional severing step to make die 28 individually removable. FIGS. 12 and 13 illustrate a second grinding or other severing step 38 removing either (1) adhesive layer 30 and a portion of dicing tape 24 at the base of grooves 23 according to the embodiment of FIG. 10B, or (2) a wafer portion 37, adhesive layer 30 and a portion of dicing tape 24 at the base of grooves 23 according to the embodiment of FIG. 11B. FIG. 14 is enlarged view similar to of FIG. 7 but illustrating how the individual die 28 remain properly positioned after the removal of back grinding tape 16 in FIG. 9 and second grinding or other severing step 38 of FIGS. 12 and 13.

Conventional or unconventional wafer transfer apparatus may be used to perform the various functions and tasks discussed above, such as to transfer first wafer assembly 32 from dicing tape application station 31 to support surface station 36. An example of an appropriate wafer transfer apparatus is that sold by Tokyo Seimitsu Co Ltd. (TSK) of Tokyo, Japan. Back grinding tape 16 may be removed using, for example, equipment also sold by TSK. The severing step of FIG. 12 may be carried out using, for example, dicing saw equipment sold by Disco Corporation of Tokyo, Japan.

Modification and variation can be made to the disclosed embodiments without departing from the subject of the invention as defined in following claims.

Any and all patents, patent applications and printed publications referred to above are incorporated by reference.

Other embodiments are within the scope of the invention.

What is claimed is:

1. A semiconductor wafer processing method comprising:
   forming an array of grooves in a first side of a wafer;
   adhering a back grinding tape to the first side;
   removing an amount of material from the second side of the wafer;
   applying an adhesive layer to the second side;
   applying dicing tape to the adhesive layer to create a first wafer assembly;
   supporting the first wafer assembly on a support surface with the dicing tape facing the support surface and the back grinding tape exposed;
   removing the back grinding tape; and
   severing the adhesive layer through the array of grooves to create individually removable die wherein the supporting step is carried out using a vacuum table as the support surface.

2. The method according to claim 1 further comprising: forming the array of grooves in the first side of the wafer to a chosen depth; and wherein the material removing step is carried out to create a wafer having a chosen thickness.

3. The method according to claim 2 wherein the forming and removing steps are carried out so that the chosen depth is greater than the chosen thickness.

4. The method according to claim 3 wherein the forming and removing steps are carried out so that the chosen depth is about 20% greater than the chosen thickness.

5. The method according to claim 2 wherein the forming and removing steps are carried out so that the chosen depth is less than the chosen thickness so that the severing step severs both the adhesive layer and wafer through the array of grooves.

6. The method according to claim 5 wherein the forming and removing steps are carried out so that the chosen depth is about 70–90% of the chosen thickness.

7. A die made according to the method of claim 5.

8. The method according to claim 1 wherein the adhesive layer and dicing tape applying steps are carried out substantially simultaneously.

9. The method according to claim 1 wherein the material removing step is carried out by grinding.

10. The method according to claim 1 wherein the groove forming step is carried out using a semiconductor dicing saw.

11. The method according to claim 1 wherein the severing step is carried out using a semiconductor dicing saw.

12. The method according to claim 1 further comprising selecting a film adhesive layer as the adhesive layer.

13. The method according to claim 1 further comprising selecting an adhesive for the adhesive layer applying step in which the adhesive strength of the adhesive is degradable by the application o(at least one of the following: UV and heat.

14. A die made according to the method of claim 1.

* * * * *